United States Patent
Lee et al.

(10) Patent No.: US 7,687,983 B2
(45) Date of Patent: Mar. 30, 2010

(54) ORGANIC LIGHT EMITTING DISPLAY AND METHOD OF FABRICATING THE SAME

(75) Inventors: Kwan-Hee Lee, Suwon-si (KR); Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1081 days.

(21) Appl. No.: 11/283,933

(22) Filed: Nov. 22, 2005

(65) Prior Publication Data

US 2006/0138418 A1    Jun. 29, 2006

(30) Foreign Application Priority Data

Nov. 23, 2004    (KR) ..................... 10-2004-0096595

(51) Int. Cl.
*H01J 1/62* (2006.01)
*H01J 63/04* (2006.01)
(52) U.S. Cl. ................. 313/503; 313/498; 313/504; 313/505; 313/506; 428/690; 428/917
(58) Field of Classification Search ................ None
See application file for complete search history.

(56) References Cited

U.S. PATENT DOCUMENTS

| 6,204,610 | B1 | 3/2001 | Komiya |
| 6,815,723 | B2 * | 11/2004 | Yamazaki et al. ............ 313/503 |
| 7,432,885 | B2 * | 10/2008 | Asano et al. ................... 345/76 |
| 2002/0190924 | A1 | 12/2002 | Asano | |

FOREIGN PATENT DOCUMENTS

| CN | 1455629 | 11/2003 |
| JP | 08-315986 | 11/1996 |
| JP | 10-012378 | 1/1998 |
| JP | 10012379 | 1/1998 |
| JP | 10-112389 | 4/1998 |
| JP | 10-321368 | 12/1998 |
| JP | 2000-243555 | 9/2000 |
| JP | 2002260859 | 9/2002 |
| JP | 2003036973 | 2/2003 |
| JP | 2003-298006 | 10/2003 |
| JP | 2004-207217 | 7/2004 |
| JP | 2004213002 | 7/2004 |
| JP | 2004327416 | 11/2004 |
| WO | 03094218 | 11/2003 |

* cited by examiner

*Primary Examiner*—Nimeshkumar D Patel
*Assistant Examiner*—Natalie K Walford
(74) *Attorney, Agent, or Firm*—H.C. Park & Associates, PLC

(57) ABSTRACT

An organic light emitting display (OLED) and a method of fabricating the same are provided. The method includes forming the OLED having upper and lower substrates that emit different colors from each other, and coupling the upper and lower substrates together.

19 Claims, 4 Drawing Sheets

ORGANIC LIGHT EMITTING DISPLAY AND METHOD OF FABRICATING THE SAME

CROSS-REFERENCE TO RELATED APPLICATION

This application claims priority to and the benefit of Korean Patent Application No. 10-2004-0096595, filed Nov. 23, 2004, which is hereby incorporated by reference for all purposes as if fully set forth herein.

BACKGROUND OF THE INVENTION

1. Field of the Invention

The present invention relates to an organic light emitting display (OLED) and a method of fabricating the same and, more particularly, to an OLED including first and second substrates attached with each other, each of which emits different colors.

2. Discussion of the Background

Generally, a cathode ray tube (CRT) is often used for a TV monitor, measuring equipment, or an information terminal. However, the CRT is not used with small and lightweight electronic products due to its weight and size.

Thin and lightweight flat panel displays (FPD) are being substituted for CRTs. Such flat panel displays generally include a liquid crystal display (LCD), an OLED, etc.

A FPD may be a passive matrix FPD or an active matrix FPD according to its driving method.

The active matrix FPD includes a thin film transistor (TFT) substrate having a TFT formed therein, and red, green and blue light emitting diodes.

The active matrix FPD generally include at least two TFTs, i.e., a switching TFT and a driving TFT, a capacitor, and a light emitting diode (LED) in each pixel.

However, with top and bottom emitting active matrix FPDs, since the TFT and the capacitor occupy a relatively large area, less space is available for forming the LED, which reduces the aperture ratio.

Additionally, in order to increase the mobility of a TFT active layer, the TFT's size may be increased, which means it occupies a larger area in the pixel.

FIG. 1 is a cross-sectional view of a conventional OLED.

Referring to FIG. 1, a buffer layer 110 having a predetermined thickness is formed on a transparent insulating substrate 100 having red (A), green (B) and blue (C) pixel regions. The buffer layer 110 prevents impurities from the transparent insulating layer 100 from being introduced into the TFT, which is subsequently formed.

Next, polysilicon layer patterns 120 are formed on the buffer layer 110, and impurities are injected into both sides of the polysilicon layer patterns 120, thereby forming source and drain regions 122 and 124, and channel regions 126 between the source and drain regions, in each pixel region A, B and C.

Next, a gate insulating layer 130 is formed on the entire surface of the resultant structure, and gate electrodes 132 are then formed to correspond to the channel regions 126 of the polysilicon layer patterns 120.

Next, an interlayer insulating layer 140 is formed on the entire surface of the resultant structure, and the interlayer insulating layer 140 and the gate insulating layer 130 are etched to form contact holes 142, which expose the source and drain regions 122 and 124. Source and drain electrodes 150 and 152 are then formed to be connected with the source and drain regions 122 and 124, respectively, through the contact holes 142.

Next, a passivation layer 160 and a planarization layer 170 are formed on the entire surface of the resultant structure.

The passivation layer 160 and the planarization layer 170 are then etched to form via-holes 172, which expose the drain electrodes 152.

Next, pixel electrodes 180 are formed to be connected with the drain electrodes 152 through the via-holes 172 in each pixel region A, B and C. The pixel electrode 180 may be a reflective electrode.

Portions of the pixel electrodes 180 are then exposed on the entire surface of the resultant structure to form a pixel defining layer pattern 182 for defining an emission region.

Next, an organic layer 190, which includes at least an emission layer, and an opposite electrode 192 are formed on the entire surface of the resultant structure. The organic layer 190 may include an emission layer that emits blue or white light.

A transparent passivation layer (not shown) is then formed on the opposite electrode 192.

A sealing substrate 200 is adhered corresponding to the transparent insulating substrate 100 to complete the OLED. A moisture absorbing agent may be formed on the sealing substrate 200.

As described above, since the conventional OLED includes a plurality of pixel regions formed in one insulating substrate, as higher resolution and brightness are required, pixel patterning may become difficult. Further, with the active matrix OLED, the aperture ratio and the OLED's lifespan may decrease since the TFT and capacitor are formed in each pixel.

SUMMARY OF THE INVENTION

The present invention provides an organic light emitting display (OLED) and a method of fabricating the same that may increase an aperture ratio and facilitate the manufacture of a large-sized OLED by forming first and second substrates, which emit different colors of light, and adhering the first and second substrates to each other.

Additional features of the invention will be set forth in the description which follows, and in part will be apparent from the description, or may be learned by practice of the invention.

The present invention discloses an OLED including a first substrate and a second substrate coupled with each other. The first substrate includes a first pixel electrode, a first organic layer having at least an emission layer, and a first opposite electrode, and the second substrate includes a second pixel electrode, a second organic layer having at least an emission layer, and a second opposite electrode. Together, the first and second substrates have first, second and third pixel regions.

The present invention also discloses a method of fabricating an organic light emitting display including forming a first pixel electrode on a first substrate having at least two pixel regions, forming a first organic layer having at least an emission layer on the first pixel electrode, and forming a first opposite electrode on the first organic layer. A second pixel electrode is formed on a second substrate having at least one pixel region, a second organic layer having at least an emission layer is formed on the second pixel electrode, and a second opposite electrode is formed on the second organic layer. The first and second substrates are coupled with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
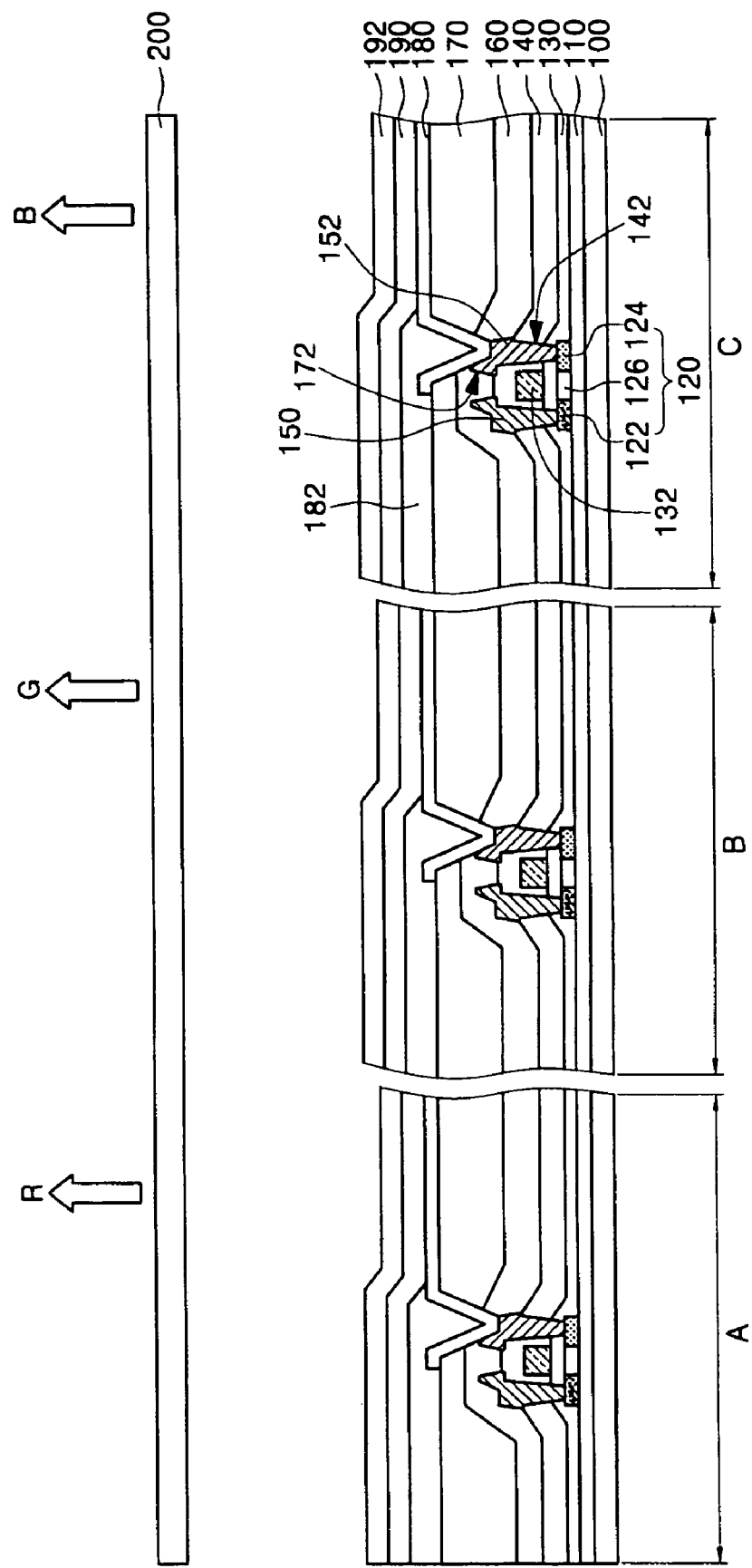
FIG. 1 is a cross-sectional view of a conventional organic light emitting display.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
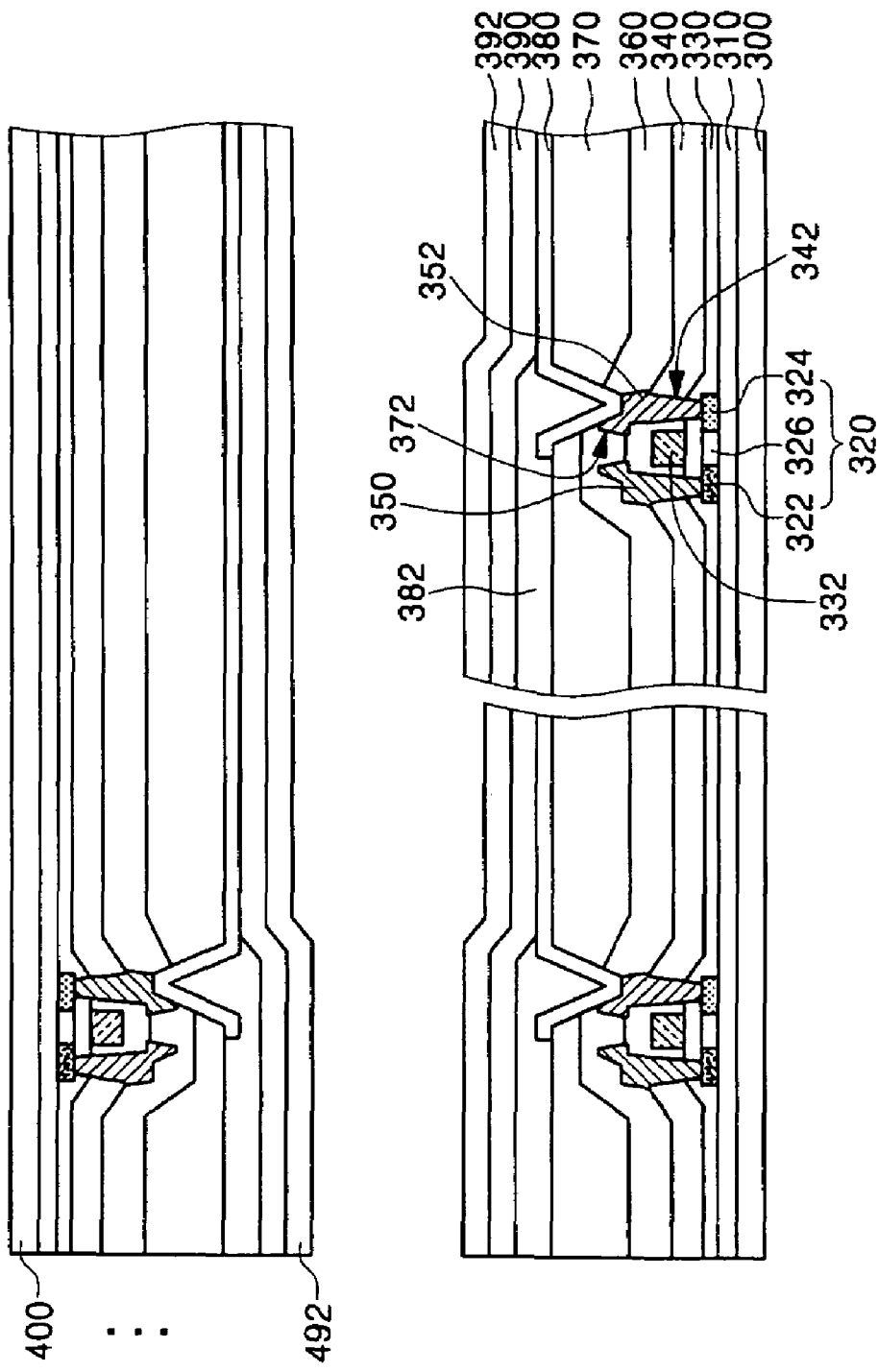
FIG. 2 is a cross-sectional view of an organic light emitting display according to an exemplary embodiment of the present invention.
Figure 4:
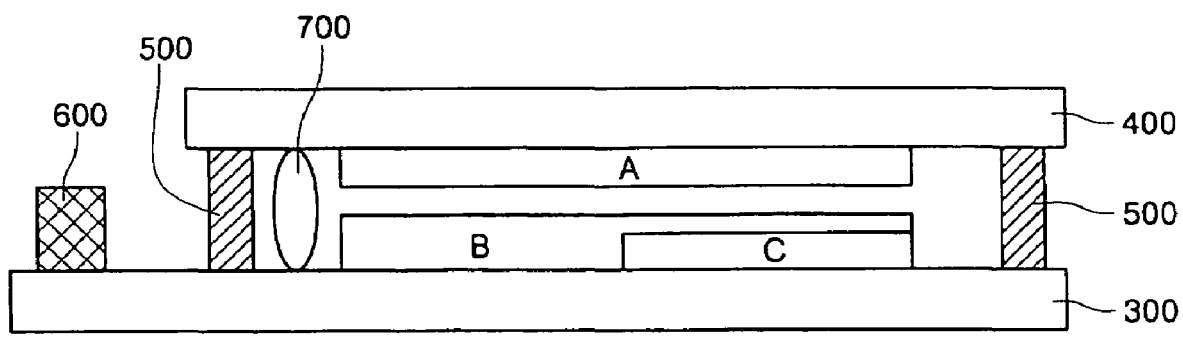
FIG. 4 is a schematic cross-sectional view of an organic light emitting display according to an exemplary embodiment of the present invention.

FIG. 2 is a cross-sectional view of an organic light emitting display (OLED) according to an exemplary embodiment of the present invention, and FIG. 4 is a schematic cross-sectional view of an OLED according to an exemplary embodiment of the present invention, which will be described in conjunction with each other.

Referring to FIG. 2, a first substrate 300 and a second substrate 400 face each other. The first substrate 300 includes a thin film transistor (TFT) having a gate electrode 332, a source electrode 350 and a drain electrode 352, a pixel electrode 380, an organic layer 390 having at least an emission layer, and an opposite electrode 392. The second substrate 400 includes a TFT, a pixel electrode, an organic layer having at least an emission layer, and an opposite electrode. The first substrate 300 includes two pixel regions, and the second substrate 400 includes one pixel region.

Hereinafter, a method of fabricating an OLED will be described with reference to FIG. 2.

A buffer layer 310 having a predetermined thickness is formed on the first substrate 300, which has at least two pixel regions. The buffer layer 310 prevents impurities leaked from the first substrate 300 from being introduced into a subsequently formed TFT.

Polysilicon layer patterns 320 may then be formed on the buffer layer 310. Impurities are injected into both sides of the polysilicon layer patterns 320, thereby forming source and drain regions 322 and 324, and channel regions 326 between the source and drain regions, in each pixel region.

A gate insulating layer 330 may then be formed on the entire surface of the resultant structure, and gate electrodes 332 may be formed to correspond to the channel regions 326 of the polysilicon layer patterns 320.

An interlayer insulating layer 340 may then be formed on the entire surface of the resultant structure, and then the interlayer insulating layer 340 and the gate insulating layer 330 are etched to form contact holes 342, which expose the source and drain regions 322 and 324. Source and drain electrodes 350 and 352 may then be formed to be electrically coupled with the source and drain regions 322 and 324, respectively, through the contact holes 342.

A passivation layer 360 and a planarization layer 370 may then be formed on the entire surface of the resultant structure.

Then, the passivation layer 360 and the planarization layer 370 may be etched to from via-holes 372, which expose the drain electrodes 352.

Next, pixel electrodes 380 may be formed to be electrically coupled with the drain electrodes 352 through the via-holes 372 in each pixel region. The pixel electrode 380 may be a reflective electrode.

Portions of the pixel electrodes 380 are exposed on the entire surface of the resultant structure to form a pixel defining layer pattern 382, which defines an emission region.

Next, an organic layer 390, having at least an emission layer, may be formed on the entire surface of the resultant structure. Here, the emission layer may be formed in the two pixel regions of the first substrate 300 using a fine metal mask (FMM) by each color, or a blue emission layer may be formed on the entire surface of the resultant structure after forming a red or green emission layer using the FMM.

Next, an opposite electrode 392 may be formed on the organic layer 390. The opposite electrode 392 may be a transparent electrode.

Similarly, the second substrate 400, which may include one pixel region, may be formed using the above method. Unlike the pixel electrode 390 formed on the first substrate 300, the pixel electrode formed on the second substrate 400 may be a transparent electrode, and the opposite electrode 492 may also be a transparent electrode. This is because the pixels formed on the first substrate 300 emit light through the second substrate 400. Additionally, the organic layer formed on the second substrate 400 may be formed on the entire surface of the substrate without using the FMM. At this time, although it is possible to form red and green emission layers in each emission region of the first substrate 300, when the blue emission layer is used as a common layer, the number of alignments may be reduced since the red or green emission layer may overlap the blue emission layer. In this case, the number of times the FMM is used may be reduced by one. As described above, by separately forming the pixel regions in the first and second substrates 300 and 400, it may be possible to increase an aperture ratio at least three times in the case of the first substrate 300, and at least nine times in case of the second substrate 400.

As shown in FIG. 4, the first and second substrates 300 and 400 may be coupled with each other using an adhesive agent 500 and a spacer 700 is formed between the first and second substrates 300 and 400. At this time, an organic insulating layer may be arranged between the first and second substrates 300 and 400. Additionally, a driver integrated circuit (IC) 600 may be attached to the periphery of one of the first and second substrates 300 and 400. For example, FIG. 4 shows the driver IC 600 attached to the first substrate 300. The first and second substrates may be electrically connected to each other using an anisotropic conductive film having conductive particles between the first and second substrates 300 and 400. FIG. 4 also shows, as an example, the second substrate 400 including the red (A) pixel region and the first substrate 300 including the green (B) pixel region and the blue (C) pixel region.

Figure 3A:
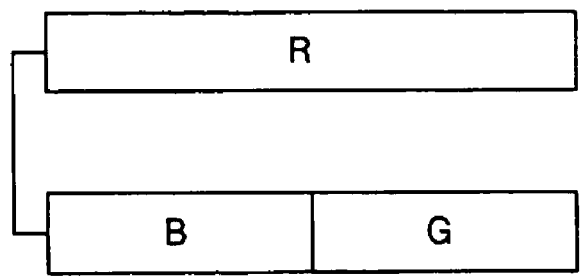
FIG. 3A, FIG. 3B, and FIG. 3C are layouts of an organic light emitting display according to exemplary embodiments of the present invention.
Figure 3B:
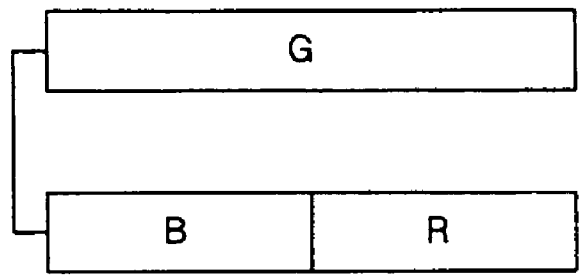
Figure 3C:
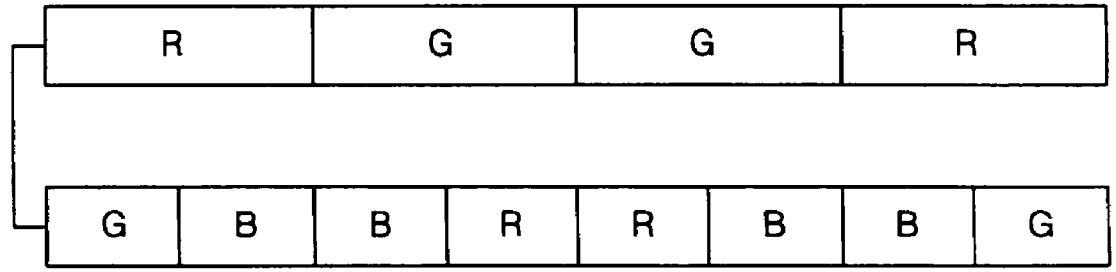

FIG. 3A, FIG. 3B and FIG. 3C are views of layouts of an OLED according to exemplary embodiments of the present invention, representing colors of emission layers to be formed on the first and second substrates.

First, FIG. 3A and FIG. 3B show red R, green G and blue B pixel regions arranged in the first and second substrates in a divided manner. In this process, the first substrate may be arranged at a lower position, and the second substrate may be arranged at an upper position.

Referring to FIG. 3A, the first substrate includes the blue pixel region B and the green pixel region G, and the second substrate includes the red pixel region R.

Referring to FIG. 3B, the first substrate includes the blue pixel region B and the red pixel region R, and the second substrate includes the green pixel region G.

FIG. 3C illustrates when the first and second substrates include red R, green G, blue B, cyan C, magenta M and yellow Y pixel regions. Here, a cyan pixel C comprises green and blue pixels G and B, a magenta pixel M comprises red and blue pixels R and B, and a yellow pixel Y comprises red and green pixels R and G. Therefore, as shown in FIG. 3C, the first substrate sequentially includes green G, blue B, blue B, red R, red R, blue B, blue B and green G pixels, and the second substrate sequentially includes red R, green G, green G and red R pixels. Each pixel may be separately driven, and the cyan, magenta and yellow pixels may be implemented by driving pixels corresponding to each color.

As described above, exemplary embodiments of the present invention may reduce the deposition number of the organic layer using the FMM and increase the aperture ratio to lengthen the lifespan of the OLED by separately forming the pixels on the two substrates by each color. Further, it may be possible to facilitate the manufacture of a large-sized OLED due to reduced process time by means of the reduced numbers of alignment.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
   a first substrate; and
   a second substrate coupled with the first substrate,
   wherein the first substrate comprises a first pixel electrode, a first organic layer comprising an emission layer, and a first opposite electrode,
   wherein the second substrate comprises a second pixel electrode, a second organic layer comprising an emission layer, and a second opposite electrode,
   wherein the first substrate and the second substrate together comprise a first pixel region, a second pixel region, and a third pixel region,
   wherein at least one thin film transistor is arranged between the first substrate and the first pixel electrode; and
   wherein at least one thin film transistor is arranged between the second substrate and the second pixel electrode.

2. The organic light emitting display of claim 1, wherein the first, second and third pixel regions are red, blue and green pixel regions, respectively.

3. The organic light emitting display of claim 2, wherein the first substrate comprises the first pixel region and the second pixel region, and the second substrate comprises the third pixel region.

4. The organic light emitting display of claim 3, wherein the first pixel region overlaps a portion of the second pixel region.

5. The organic light emitting display of claim 2, wherein the first substrate comprises the second pixel region and the third pixel region, and the second substrate comprises the first pixel region.

6. The organic light emitting display of claim 5, wherein the third pixel region overlaps a portion of the second pixel region.

7. The organic light emitting display of claim 2, wherein the first substrate comprises the first pixel region, the second pixel region and the third pixel region, and the second substrate comprises the first pixel region and the third pixel region.

8. The organic light emitting display of claim 7, wherein the second substrate comprises the first, third, third and first pixel regions, which are sequentially arranged, and the first substrate comprises the third, second, second, first, first, second, second and third pixel regions, which are sequentially arranged.

9. The organic light emitting display of claim 8, wherein the second substrate emits red, green and yellow light, and the first substrate emits red, green, blue, cyan and magenta light.

10. The organic light emitting display of claim 9, wherein the yellow light comprises red and green light, the cyan light comprises green and blue light, and the magenta light comprises blue and red light.

11. The organic light emitting display of claim 1, further comprising a driver integrated circuit arranged on one of the first substrate and the second substrate.

12. The organic light emitting display of claim 1, further comprising an anisotropic conductive layer arranged between the first substrate and the second substrate.

13. The organic light emitting display of claim 1, wherein the first substrate comprises a top emission organic light emitting display, and the second substrate comprises a dual emission organic light emitting display.

14. The organic light emitting display of claim 1, further comprising an organic insulating layer arranged between the first substrate and the second substrate.

15. The organic light emitting display of claim 1, wherein the first pixel electrode is formed of a reflective electrode.

16. The organic light emitting display of claim 1, wherein the first opposite electrode, the second pixel electrode and the second opposite electrode are formed of transparent electrodes.

17. The organic light emitting display of claim 1, wherein the first organic layer comprises a blue emission layer as a common layer corresponding to the at least two pixel regions.

18. The organic light emitting display of claim 1, further comprising arranging an anisotropic conductive film between the first substrate and the second substrate to electrically couple the first substrate and the second substrate.

19. The organic light emitting display of claim 1, further comprising forming an organic insulating layer between the first substrate and the second substrate.

* * * * *